(12) United States Patent
Chen

(10) Patent No.: US 7,855,419 B2
(45) Date of Patent: Dec. 21, 2010

(54) ESD DEVICE LAYOUT FOR EFFECTIVELY REDUCING INTERNAL CIRCUIT AREA AND AVOIDING ESD AND BREAKDOWN DAMAGE AND EFFECTIVELY PROTECTING HIGH VOLTAGE IC

(75) Inventor: Tung-Yang Chen, Tainan (TW)

(73) Assignee: Himax Technologies Limited (TW)

( * ) Notice: Subject to any disclaimer, the term of this patent is extended or adjusted under 35 U.S.C. 154(b) by 0 days.

(21) Appl. No.: 11/424,455

(22) Filed: Jun. 15, 2006

(65) Prior Publication Data

US 2007/0290290 A1 Dec. 20, 2007

(51) Int. Cl.
*H01L 23/62* (2006.01)
(52) U.S. Cl. .......................... 257/362; 257/355; 257/360; 257/356; 257/357; 257/363; 257/389; 257/401; 257/E23.07; 257/E23.151; 257/E29.026; 257/E29.12; 361/56
(58) Field of Classification Search ................. 257/206, 257/401, E23.07, E23.151, E29.026, E29.12, 257/362, 355, 360, 356, 357, 363, 389; 361/56
See application file for complete search history.

(56) References Cited

U.S. PATENT DOCUMENTS 5,742,083 A * 4/1998 Lin .............................. 257/355
5,763,919 A * 6/1998 Lin .............................. 257/360
6,707,113 B1 * 3/2004 Kobayashi .................. 257/368
6,713,818 B2 * 3/2004 Kodama ..................... 257/362
7,129,546 B2 * 10/2006 Ker et al. .................... 257/360
2005/0029597 A1 * 2/2005 Worley ........................ 257/355

* cited by examiner

*Primary Examiner*—Lynne A Gurley
*Assistant Examiner*—Meiya Li
(74) *Attorney, Agent, or Firm*—Baker & McKenzie LLP

(57) ABSTRACT

An improved layout pattern for electrostatic discharge protection is disclosed. A first heavily doped region of a first type is formed in a well of said first type. A second heavily doped region of a second type is formed in a well of said second type. A battlement layout pattern of said first heavily doped region is formed along the boundary of said first heavily doped region and said second heavily doped region. A battlement layout pattern of said second heavily doped region is formed along the boundary of said first heavily doped region and said second heavily doped region. By adjusting a distance between the battlement layout pattern of a heavily doped region and a edge of well of said second type, i.e. n-well, a first distance will be shorter than what is typically required by the layout rules of internal circuit; and a second distance will be longer than the first distance to ensure that the I/O device have a better ESD protection capability. Accordingly, by properly adjusting the breakdown voltage of ESD device within I/O circuit, i.e. adjusting the distance between the edge of n-well and the battlement layout pattern of heavily doped regions, it will help to reduce the chip area and improve the ESD reliability.

11 Claims, 3 Drawing Sheets

US 7,855,419 B2

ESD DEVICE LAYOUT FOR EFFECTIVELY REDUCING INTERNAL CIRCUIT AREA AND AVOIDING ESD AND BREAKDOWN DAMAGE AND EFFECTIVELY PROTECTING HIGH VOLTAGE IC

BACKGROUND

1. Field of the Invention

The present invention relates generally to electrostatic discharge protection for semiconductor integrated circuitry and more particularly to an improved layout structure/pattern for electrostatic discharge protection 2. Background of the Invention Static electricity has been an industrial problem for centuries. Since ancient time, people employed basic grounding and flame ionization techniques to dissipate static electricity and to refrain from ignition to combustible objects. The age of electronics brought with it new problems associated with static electricity and electrostatic discharge ("ESD"). And as electronic devices become faster and smaller, their sensitivity to ESD also increases.

Static electricity is defined as an electrical charge caused by an imbalance of electrons on the surface of a material. ESD is defined as the transfer of charge between bodies at different electrical potentials. ESD can change the electrical characteristics of a semiconductor device by either degrading or destroying it. The ESD damage may be either a catastrophic failure or a latent defect which may cause the semiconductor device no longer function or be partially degraded and experience premature failure. It will increase the associated costs for repair, replacement, and et al.

The protection of integrated circuits from ESD has received a lot of attention.

Many researchers in this field have proposed solutions to protect submicron devices without requiring any increase of silicon chip area. Because die size is the major cost factor for silicon fabricated products, layout rules followed by many modern time ICs need to be adjusted. According to conventional layout rules, the distance between two adjacent regions, such as between a well of a conductivity type and a heavily doped region, takes a lot of circuit area especially within high voltage area of, for example, a TFT Driver IC. The outermost ESD circuit device within an input/output circuit ("I/O") will induce ESD disaster if the ESD circuit device follows the same conventional layout rules. It may not be able to safeguard the whole chip against ESD because the breakdown voltage of internal circuit will be lower than the breakdown voltage of I/O circuit. On the other hand, if the ESD circuit device follows that same layout rules as internal circuit, it will affect the durability of the ESD circuit when the IC is not connected to the circuit board and/or power-off and/or floating.

Referring now to FIG. 1, an example of a prior art layout pattern of a heavily doped region in a well is shown. A p type heavily doped region 30 and an n type heavily doped region 40 are formed in a p-well 10 and an n-well 20, respectively. A distance between a p type heavily doped region edge 300 and an n type well edge 200 is S1. A distance between an n type heavily doped region edge 400 and the n type well edge 200 is S2. Generally, S1 and S2 will be maintained at the same distance.

However, in order to reduce silicon chip area, the layout rules of the internal circuit need to be adjusted. As a result, the ESD device within I/O circuit will not be able to function properly to protect the internal circuit from power noise damage. On the other hand, reducing the distance S1 and S2 to safeguard the internal circuit will affect the ESD current clamping ability when the IC is not connected to the circuit board and/or power-off and/or floating.

SUMMARY

Therefore, it is an object of this invention to solve the problem where, within an internal circuit, the distance between a well of a conductivity type and a heavily doped region is shorter than the distance between a well of a conductivity type and a heavily doped region of the I/O circuit. The problem causes the p-n well junction breakdown voltage of internal circuit to be lower than the p-n well junction breakdown voltage of I/O circuit. Hence, the internal circuit will suffer from the damage of abrupt voltage pulse.

The above problem can be resolved by applying two different distances between a well of a conductivity type and a heavily doped region within a layout structure. A first distance will be shorter than the layout rules of internal circuit, and a second distance will be longer than the first distance, in order to achieve a better ESD protection capability.

By properly adjusting the breakdown voltage of I/O circuit, i.e. adjusting the distance between a well of a conductivity type and a heavily doped region according to the proposed method, it will help to reduce the chip area as well as curtailing the ESD reliability issue. The present invention will improve a product's ESD durability.

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

The preferred embodiments of the present invention disclose a battlement layout pattern of a heavily doped region in a well having improved ESD performance. By applying a shorter distance between a well and a heavily doped region, the breakdown voltage of I/O circuit will be lower than the breakdown voltage of internal circuit during the DC operation. Also, a p-n well junction will turn on and a discharging ESD current will protect the internal circuit from power noise damage. By applying a longer distance between a well and a heavily doped region, the I/O circuit will be able to clamp the ESD current when the IC is not connected to a circuit board and/or power-off and/or floating. It should be clear to those experienced in the art that other variations can be applied without deviating from the scope of the present invention.

Figure 2:
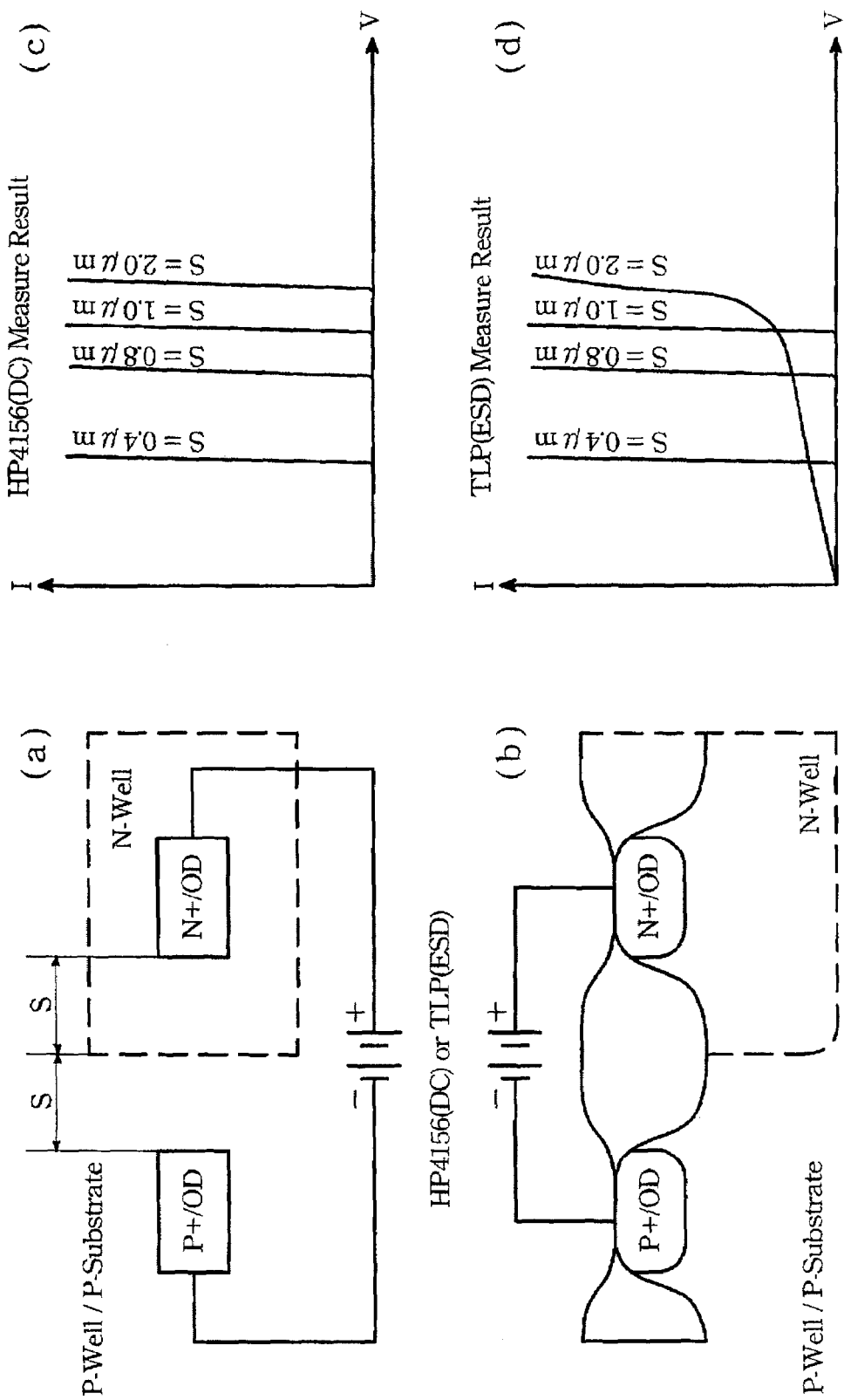
FIG. 2(a) illustrates the measurement of breakdown I-V curve for a p-well and n-well junction of the present invention in a top layout view where a positive voltage is applied to an n type heavily doped region and a negative voltage is applied to an p type heavily doped region.
FIG. 2(b) illustrates the measurement of breakdown I-V curve for a p-well and n-well junction of the present invention in a cross-section view where a positive voltage is applied to an n type heavily doped region and a negative voltage is applied to a p type heavily doped region.
FIG. 2(c) illustrates the DC measurement of breakdown I-V curve with various distances between a well of a conductivity type and a heavily doped region.
FIG. 2(d) illustrates the ESD measurement of breakdown I-V curve with various distances between a well of a conductivity type and a heavily doped region.

In FIGS. 2(a) and 2(b), a p type heavily doped region is formed in a p-well and an n type heavily doped region is formed in an n-well. The distance between an n-well edge and an n type heavily doped region is S; the distance between the same n-well edge and a p type heavily doped region is S. A positive voltage is applied to the n type heavily doped region and a negative voltage is applied to the p type heavily doped region in order to measure the I-V curve of a p-n well junction breakdown with various distances at DC operation and/or off power.

In FIG. 2(c), during a DC operation a smaller distance S will have a relatively small breakdown voltage of ESD circuit device within I/O circuit compared to the breakdown voltage of internal circuit. Once an abrupt power noise pulse occurs, the p-n well junction breakdown of ESD circuit device will clamp the voltage at the corresponding value according to the I-V curve of FIG. 2(c), and discharge the current. It will help to protect the internal circuit from power noise damage.

In FIG. 2(d), when an IC is not connected to a circuit board and/or power-off and/or floating, the I-V curve of FIG. 2(d) will describe the characteristics of ESD discharging current. In order to get the best ESD characteristics, the distance S will be increased and usually will at least have to meet the layout rules specified by the foundry. Once an abrupt voltage occurs, the p-n well junction, with a larger distance S e.g. S=2.0 μm, of ESD circuit device will turn on and discharge the current. In other words, when other p-n well junctions with a relatively smaller distance S have not reached their breakdown voltages, the p-n well junction with largest distance S already turns on and discharges the current to protect the IC.

First Embodiment

Figure 1:
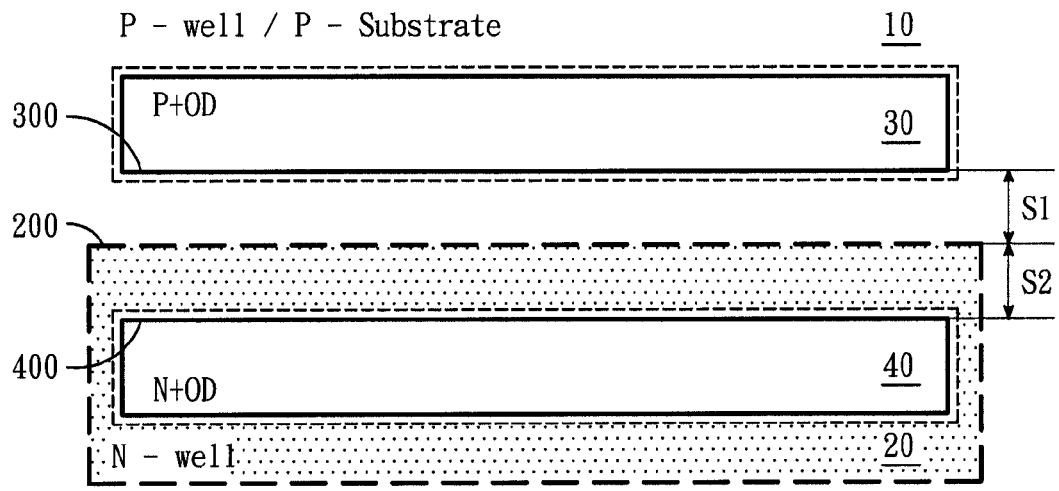
FIG. 1 illustrates a prior art guard-ring layout pattern of ESD device based on the layout rules specified by a foundry.
Figure 3:
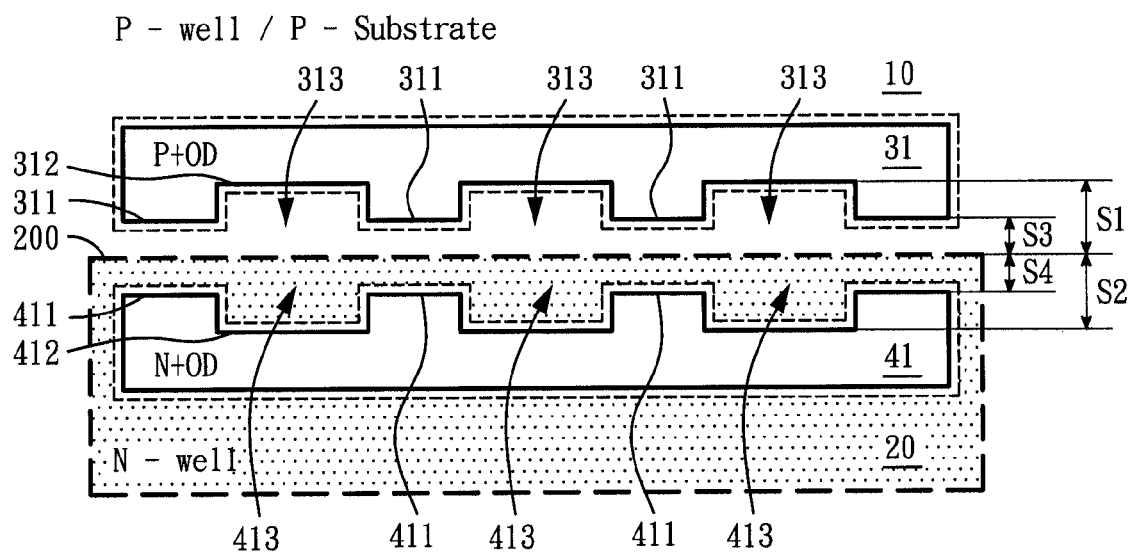
FIG. 3 illustrates the first preferred embodiment of the present invention in a top layout view where the first heavily doped region and the second heavily doped region have battlement layout patterns.

In FIG. 3, a first well 10 of a first type is formed on a semiconductor substrate. A second well 20 of a second type, alongside the first well 10, is also formed. According to one embodiment, a first heavily doped region 31 and a second heavily doped region 41 are formed in the wells 10 and 20. Particularly, the first heavily doped region 31 of the first type is formed in the first well 10. The second heavily doped region 41 of the second type is formed in the second well 20. In one embodiment, the first heavily doped region 31 comprises a p+ type region formed in the p-well 10 having a battlement layout pattern along the boundary between the first and the second wells. The second heavily doped region 41 comprises an n+ type region formed in the n-well 20 having a battlement layout pattern along the boundary between the first and the second wells. In one embodiment, those concave shape regions in the second heavily doped region 41 are opposite to those concave shape regions in the first heavily doped region 31 as shown in the figure.

Furthermore, a distance between a top of the first heavily doped region battlement layout 311 and the second well edge 200 is S3. A distance between a top of the second heavily doped region battlement layout 411 and the second well edge 200 is S4. A distance between a bottom of the first heavily doped region battlement layout 312 and the second well edge 200 is S1. A distance between a bottom of the second heavily doped region battlement layout 412 and the second well edge 200 is S2. The distances S3 and S4 are arranged to be less than what is typically required by the layout rule of internal circuit. If the DC power noise occurs, the abrupt power noise pulse will breakdown the p-n well junction of ESD circuit device and discharge ESD current to protect the internal circuit. However, S3 and S4 may not be curtailed unlimitedly. S3 and S4 have to maintain a certain length to ensure the breakdown voltage of the p-n well junction of ESD circuit device to be greater than 1.5 times of DC operation voltage of the IC. The distance S1 and S2 are arranged to have a better ESD durability. Generally, S1 and S2 will be greater than S3 and S4, and more specifically S1 is equal to S2 and S3 is equal to S4.

Second Embodiment

Figure 4:
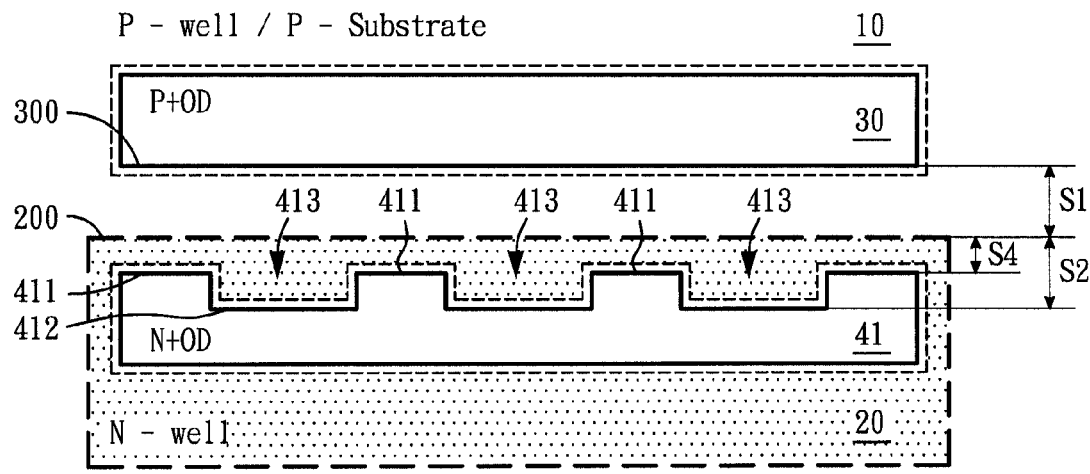
FIG. 4 illustrates the second preferred embodiment of the present invention in a top layout view where the second heavily doped region has a battlement layout pattern.

In FIG. 4, a first well 10 of a first type is formed on a semiconductor substrate. A second well 20 of a second type, alongside the first well 10, is also formed. According to one embodiment, a first heavily doped regions 30 and a second heavily doped region 41 are formed in the wells 10 and 20. Particularly, the first heavily doped region 30 of the first type is formed in the first well 10. The second heavily doped region 41 of the second type is formed in the second well 20. In one embodiment, the first heavily doped region 30 comprises a p+ type region formed in the p-well 10. The second heavily doped region 41 comprises an n+ type region formed in the n-well 20 having a battlement layout pattern along the boundary between the first and the second wells.

In FIG. 3, a first well 10 of a first type is formed on a semiconductor substrate. A second well 20 of a second type, alongside the first well 10, is also formed. According to one embodiment, a first heavily doped region 31 and a second heavily doped region 41 are formed in the wells 10 and 20. Particularly, the first heavily doped region 31 of the first type is formed in the first well 10. The second heavily doped region 41 of the second type is formed in the second well 20. In one embodiment, the first heavily doped region 31 comprises a p+ type region formed in the p-well 10 having a battlement layout pattern including a plurality of recessed concave regions 313 and ridges 311 along a side facing the boundary between the first and the second wells 10 and 20. As shown, the first well 10 of the first doping type occupies entirely each of the recessed concave regions 313, and extends continuously from each of the recessed concave regions 313 and ridges 311 to the boundary between the first and second wells 10 and 20. The second heavily doped region 41 comprises an n+ type region formed in the n-well 20 having a battlement layout pattern including a plurality of recessed concave regions 413 and ridges 411 along a side facing the boundary between the first and the second wells 10 and 20. In the same manner, the second well 20 of the second doping type occupies entirely each of the recessed concave regions 413, and extends continuously from each of the recessed concave regions 413 and ridges 411 to the boundary between the first and second wells 10 and 20. In one embodiment, the recessed concave regions 413 in the second heavily doped region 41 are respectively opposite to the recessed concave regions 313 in the first heavily doped region 31 as shown in the figure.

Third Embodiment

Furthermore, a distance between each ridge 311 of the first heavily doped region 31 and the edge 200 of the second well 20 facing the ridges 311 is S3. A distance between each ridge 411 of the second heavily doped region 41 and the edge 200 of the second well 20 is S4. A distance between a bottom 312 of each recessed concave region 313 and the edge 200 of the second well 20 is S1. A distance between a bottom 412 of each recessed concave region 413 and the edge 200 of the second well 20 is S2. The distances S3 and S4 are arranged to be less than what is typically required by the layout rule of internal circuit. If the DC power noise occurs, the abrupt power noise pulse will breakdown the p-n well junction of the ESD circuit device and discharge ESD current to protect the internal circuit. However, S3 and S4 may not be curtailed unlimitedly. S3 and S4 have to maintain a certain length to ensure the breakdown voltage of the p-n well junction of the ESD circuit device to be greater than 1.5 times the DC operation voltage of the IC. The distances S1 and S2 are arranged to have a better ESD durability. Generally, S1 and S2 will be greater than S3 and S4, and more specifically S1 is equal to S2 and S3 is equal to S4.

In FIG. 4, a first well 10 of a first type is formed on a semiconductor substrate. A second well 20 of a second type, alongside the first well 10, is also formed. According to one embodiment, a first heavily doped region 30 and a second heavily doped region 41 are formed in the wells 10 and 20. Particularly, the first heavily doped region 30 of the first type is formed in the first well 10. The second heavily doped region 41 of the second type is formed in the second well 20. In one embodiment, the first heavily doped region 30 comprises a p+ type region formed in the p-well 10. The second heavily doped region 41 comprises an n+ type region formed in the n-well 20 having a battlement layout pattern including the recessed concave regions 413 and ridges 411 along a side facing the boundary between the first and the second wells 10 and 20. Like in the previous embodiment, the second well 20 of the second doping type occupies entirely each of the recessed concave regions 413, and extends continuously from each of the recessed concave regions 413 and ridges 411 to the boundary between the first and second wells 10 and 20.

Furthermore, a distance between the edge 300 of the first heavily doped region 30 and the edge 200 of the second well 20 facing each other is S1. A distance between each ridge 411 of the second heavily doped region 41 and the edge 200 of the second well 20 is S4. A distance between the bottom 412 of each recessed concave region 413 and the edge 200 of the second well 20 is S2. The distance S4 is arranged to be less than what is typically required by the layout rule of internal circuit. If the DC power noise occurs, the abrupt power noise pulse will breakdown the p-n well junction of the ESD circuit device and discharge ESD current to protect the internal circuit. However, S4 may not be curtailed unlimitedly. S4 has to maintain a certain length to ensure the breakdown voltage of the p-n well junction of the ESD circuit device to be greater than 1.5 times the DC operation voltage of the IC. The distances S1 and S2 are arranged to have a better ESD durability. Generally, S1 and S2 will be greater than S4, and more specifically, S1 is equal to S2.

Figure 5:
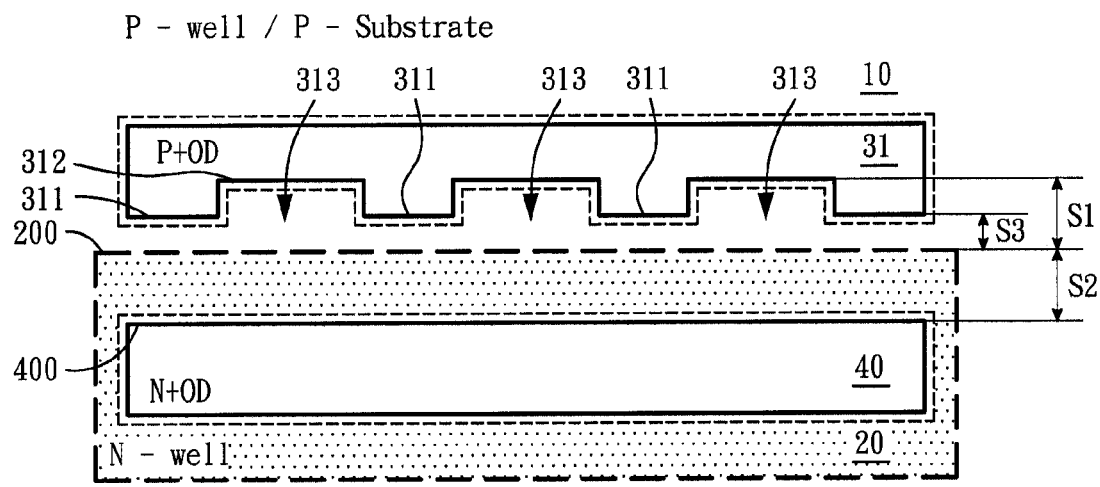
FIG. 5 illustrates the third preferred embodiment of the present invention in a top layout view where the first heavily doped region has a battlement layout pattern.

In FIG. 5, a first well 10 of a first type is formed on a semiconductor substrate. A second well 20 of a second type, alongside the first well 10, is also formed. According to one embodiment, a first heavily doped region 31 and a second heavily doped region 40 are formed in the wells 10 and 20. Particularly, the first heavily doped region 31 of the first type is formed in the first well 10. The second heavily doped region 40 of the second type is formed in the second well 20. In one embodiment, the first heavily doped region 31 comprises a p+ type region formed in the p-well 10 having a battlement layout pattern including the recessed concave regions 313 and ridges 311 along a side facing the boundary between the first and the second wells 10 and 20. Likewise, the first well 10 of the first doping type occupies entirely each of the recessed concave regions 313, and extends continuously from each of the recessed concave regions 313 and ridges 311 to the boundary between the first and second wells 10 and 20. The second heavily doped region 40 comprises an n+ type region formed in the n-well 20.

Furthermore, a distance between each ridge 311 of the first heavily doped region 31 and the edge 200 of the second well 20 is S3. A distance between the region edge 400 of the second heavily doped region 40 and the edge 200 of the second well 20 is S2. A distance between the bottom 312 of each recessed concave region 313 and edge 200 of the second well 20 is S1. The distance S3 is arranged to be less than what is typically required by the layout rule of internal circuit. If the DC power noise occurs, the abrupt power noise pulse will breakdown the p-n well junction of the ESD circuit device and discharge ESD current to protect the internal circuit. However, S3 may not be curtailed unlimitedly. S3 has to maintain a certain length to ensure the breakdown voltage of the p-n well junction of the ESD circuit device to be greater than 1.5 times the DC operation voltage of the IC. The distances S1 and S2 are arranged to have a better ESD durability. Generally, S1 and S2 will be greater than S3, and specifically, S1 is equal to S2.

What is claimed is:

1. A layout pattern for protecting a circuit from electrostatic discharge, comprising:
    a first heavily doped region of a first doping type in a first well of said first doping type; and
    a second heavily doped region of a second doping type in a second well of said second doping type, wherein said second heavily doped region comprises a battlement layout pattern having protruding ridges and recessed concave regions along a side directly facing a boundary between said first and said second wells,
    wherein only the second well of the second doping type occupies entirely each of the recessed concave regions and extends continuously from each of the recessed concave regions to the boundary between said first well and said second well.

2. The layout pattern as claimed in claim 1, wherein said first doping type is p type and said second doping type is n type.

3. The layout pattern as claimed in claim 1, wherein said first doping type is n type and said second doping type is p type.

4. The layout pattern as claimed in claim 1, wherein said first heavily doped region comprises a second battlement layout pattern having second recessed concave regions directly facing said boundary between said first and said second wells.

5. The layout pattern as claimed in claim 4, wherein at least one concave region of the battlement layout pattern in said second heavily doped region is opposite to at least one of the second recessed concave regions of the second battlement layout pattern in said first heavily doped region.

6. A method of forming a layout pattern for protecting a circuit from electrostatic discharge, said method comprising the steps of:
    forming a first heavily doped region of a first doping type in a first well of said first doping type; and
    forming a second heavily doped region of a second doping type in a second well of said second doping type, wherein said second heavily doped region comprises a battlement layout pattern having protruding ridges and recessed concave regions along a side directly facing a boundary between said first and said second wells, wherein only the second well of the second doping type occupies entirely each of the recessed concave regions and extends continuously from each of the recessed concave regions to the boundary between said first well and said second well.

7. The method as claimed in claim 6, wherein said first doping type is p type and said second doping type is n type.

8. The method as claimed in claim 6, wherein said first doping type is n type and said second doping type is p type.

9. The method as claimed in claim 6, wherein said first heavily doped region comprises a second battlement layout pattern having second recessed concave regions facing said boundary between said first and said second wells.

10. The method as claimed in claim 9, wherein at least one concave region of the battlement layout pattern in said second heavily doped region is opposite to at least one of the second recessed concave regions of the second battlement layout pattern in said first heavily doped region.

11. A layout pattern for protecting a circuit from electrostatic discharge, comprising:
- a first well of a first doping type;
- a second well of a second doping type;
- a first heavily doped region of said first doping type in said first well; and
- a second heavily doped region of said second doping type in said second well;
- wherein said second heavily doped region comprises one or more recessed concave region along a side directly facing said first heavily doped region,
- wherein only the second well of the second doping type occupies entirely each of the recessed concave regions and extends continuously from each of the recessed concave regions to the boundary between said first well and said second well.

* * * * *